United States Patent [19]
Zheng et al.

[11] Patent Number: 5,882,982
[45] Date of Patent: Mar. 16, 1999

[54] TRENCH ISOLATION METHOD

[75] Inventors: Jie Zheng, Palo Alto; Calvin Todd Gabriel, Cupertino; Suzanne Monsees, Campbell, all of Calif.

[73] Assignee: VLSI Technology, Inc., San Jose, Calif.

[21] Appl. No.: 786,365

[22] Filed: Jan. 16, 1997

[51] Int. Cl.[6] .................................................... H01L 21/76
[52] U.S. Cl. ...................... 438/424; 438/701; 438/713; 438/978
[58] Field of Search ...................... 438/424, 435, 438/437, 227, 701, 978, 713, 719, 120

[56] References Cited

U.S. PATENT DOCUMENTS

| | | |
|---|---|---|
| 4,475,982 | 10/1984 | Lai et al. . |
| 4,534,826 | 8/1985 | Goth et al. . |
| 4,639,288 | 1/1987 | Price et al. . |
| 4,729,815 | 3/1988 | Leung . |
| 4,916,511 | 4/1990 | Douglas . |
| 5,182,234 | 1/1993 | Meyer . |
| 5,334,281 | 8/1994 | Doerre et al. . |
| 5,522,966 | 6/1996 | Komura et al. . |
| 5,545,290 | 8/1996 | Douglas . |
| 5,665,203 | 9/1997 | Lee et al. . |
| 5,674,782 | 10/1997 | Lee et al. . |

OTHER PUBLICATIONS

Zhao, G., et al, "Silicon Shallow Trench Etch Using HBr/Cl2/He–O2 Chemistry", Proceedings of the Eleventh Int'l Symp. on Plasma Processing, pp. 410–415 May 1996.

Wolf, S., "Silicon Processing for the VLSI Era: vol. 2, Process Integration", Lattice Press, pp. 51–56 1990.

W. H. Juan et al., "Control of Etch Profile for Fabrication of Si Microsensors", May/June. 1996, J. Vac. Sci Technolog. A 14(3), pp. 1189–1193.

K. Blumenstock, "Shallow Trench Isolation for Ultra–Large–Scale Integrated Devices", Jan./Feb. 1994, J. Vac. Sci Technolog. B 12(1), pp. 54–58.

T. Syau et al., "Reactive Ion Etching of Silicon Trenches Using $SF_6O_2$ Gas Mixtures" Oct. 1991, J. Electrochem. Sco., 138 (10), pp. 3076–3080.

H. Crazzolara et al., "Profile Control Possibilities for a Trench Etch Process Based on Chlorine Chemestry", Feb. 1990, J. Electrochem. Sco., 137 (2) pp. 708–7012.

R. N. Carlile et al., "Trench Etches in Silicon With Controllable Sidewall Angels" Aug. 1988, J. Electrochem. Soc., 135 (8), pp. 2058–2064.

*Primary Examiner*—George Fourson
*Attorney, Agent, or Firm*—Wagner, Murabito & Hao

[57] ABSTRACT

A shallow trench isolation structure and method for forming such structure. In one embodiment, the semiconductor device isolating structure of the present invention includes a trench formed into a semiconductor substrate. A cross-section of the trench has a first sidewall sloping inwardly towards the center of a substantially planar bottom surface, and a second sidewall sloping inwardly towards the center of the substantially planar bottom surface. Additionally, a cross section of the trench has a first rounded bottom trench corner at an interface of the first sidewall and the substantially planar bottom surface, and a second rounded bottom trench corner at an interface of the second sidewall and the substantially planar bottom surface. Furthermore, the trench of the present invention has a first rounded upper trench corner at the interface of the first sidewall and the top surface of the semiconductor substrate, and a second rounded upper trench corner at the interface of the second sidewall and the top surface of the semiconductor substrate. Thus, the trench of the present invention does not have micro-trenches formed into the bottom surface thereof Additionally, the present invention does not have the sharp upper and bottom comers found in conventional trenches formed using a shallow trench isolation method. The present invention also provides a method to eliminate deleterious micromasking and spike formation.

27 Claims, 7 Drawing Sheets

TRENCH ISOLATION METHOD

TECHNICAL FIELD

The present claimed invention relates to the field of semiconductor devices. More specifically, the present claimed invention relates to semiconductor device isolating structures.

BACKGROUND ART

Shallow groove isolation, sometimes referred to as "shallow trench isolation" (STI), is a semiconductor fabrication technique used in the formation of semiconductor device isolating structures. As an example, STI can be used to form a field oxide region separating two semiconductor devices. More specifically, STI is sometimes used as an alternative to conventional semiconductor device isolating methods such as, for example, local oxidation of silicon (LOCOS).

Referring now to Prior Art FIGS. 1A–1C, side-sectional views illustrating steps used in a prior art STI process are shown. As shown in Prior Art FIG. 1A, a substrate 100 has an oxide 102 and nitride 104 stack formed thereon. The oxide 102 and nitride 104 stack are used to mask underlying semiconductor substrate 100 during subsequent STI process steps.

As shown in Prior Art FIG. 1B, using conventional masking and photolithography steps, a typical STI process forms an opening 106 extending through the oxide 102 and nitride 104 stack. Opening 106 extends to the top surface of semiconductor substrate 100.

Referring next to FIG. 1C, in a conventional STI process, a plasma etch or other type of dry etch is then used to etch an opening or "trench" 108 into semiconductor substrate 100. In a conventional STI process, a common etch chemistry of chlorine and hydrogen bromide ($Cl_2$/HBr) is used to etch trench 108 into semiconductor substrate 100. As shown in the cross-sectional view of trench 108 in Prior Art FIG. 1C, a conventional STI process results in the formation of a trench 108 having micro-trenches 110 and 112 formed into the bottom surface thereof. Thus, a trench formed by a conventional STI process does not have a substantially planar bottom surface. As a result, when a prior art trench 108 is subsequently filled with dielectric material, voids are often created in and around micro-trenches 110 and 112. Such voids reduce semiconductor device isolation effectiveness and device reliability.

As yet another drawback, trench 108, formed by a conventional STI process, has a vertical sidewall profile. That is, sidewalls 113a and 113b are vertically oriented. As a result, adhesion of subsequently deposited dielectric material to sidewalls 113a and 113 is adversely affected. Poor adhesion of the dielectric material to sidewalls 113a and 113b compromises the integrity of the semiconductor isolating device.

Referring still to Prior Art FIG. 1C, conventionally fabricated trench 108 contains yet another substantial disadvantage. Namely, the interface of vertically oriented sidewalls 113a and 113b and the top surface of semiconductor substrate 100 produces sharp corners 114 and 116. As a result, stress in the contact between subsequently deposited dielectric material and semiconductor substrate 100 is generated at sharp corners 114 and 116. Such sharp corners 114 and 116 and resultant stresses contribute to poor leakage protection and poor gate oxide integrity.

Additionally, in order for a shallow trench isolation structure forming method to be functional, the method must not create micromasking structures. Such micromasking structures, in turn, can result in the subsequent formation of spikes in the shallow trench.

Thus, a need exists for a shallow trench isolation formed structure which does not have micro-trenches formed therein. A further need exists for a shallow trench isolation formed structure which enhances sidewall bonding of a dielectric material thereto. Still another need exists for a shallow trench isolation formed structure which does not have sharp stress-generating corners. Yet another need exists for a shallow trench isolation structure forming method which does not create micromasking structures.

DISCLOSURE OF THE INVENTION

The present invention provides a shallow trench isolation formed structure which does not have micro-trenches formed therein. The present invention further provides a shallow trench isolation formed structure which enhances sidewall bonding of a dielectric material thereto. Additionally, the present invention provides a shallow trench isolation formed structure which does not have sharp stress-generating corners. The present invention achieves the above accomplishments with a shallow trench isolation formed structure having ideal physical characteristics. The present invention further provides a shallow trench isolation structure forming method which does not create micromasking structures.

Specifically, in one embodiment, the semiconductor device isolating structure of the present invention includes a trench formed into a semiconductor substrate. A cross-section of the trench has a first sidewall sloping inwardly towards the center of a substantially planar bottom surface, and a second sidewall sloping inwardly towards the center of the substantially planar bottom surface. Additionally, a cross section of the trench has a first rounded bottom trench corner at an interface of the first sidewall and the substantially planar bottom surface, and a second rounded bottom trench corner at an interface of the second sidewall and the substantially planar bottom surface. Furthermore, the trench of the present invention has a first rounded upper trench corner at the interface of the first sidewall and the top surface of the semiconductor substrate, and a second rounded upper trench corner at the interface of the second sidewall and the top surface of the semiconductor substrate. Thus, the trench of the present invention does not have micro-trenches formed into the bottom surface thereof. Additionally, the present invention does not have the sharp upper and bottom corners found in conventional trenches formed using a shallow trench isolation method.

In another embodiment of the present invention, a trench forming method in accordance with the present claimed invention is disclosed. In such an embodiment, helium, oxygen, chlorine, and hydrogen bromide are introduced into an etching environment. A semiconductor substrate is then etched, within the etching environment, until a trench of a desired depth is formed into the semiconductor substrate. In the present embodiment, the location of the trench in the semiconductor substrate is defined by a mask layer disposed above the semiconductor substrate. After the trench has been formed, the trench is filled with a dielectric material. The present invention then removes excess dielectric material such that the dielectric material is substantially coplanar with the top surface of the mask layer disposed above the semiconductor substrate. Then, the present invention removes the mask layer such that a semiconductor isolating device is formed into and extends above the semiconductor substrate.

The present invention also provides a method to eliminate deleterious micromasking and spike formation.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

Prior Art

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
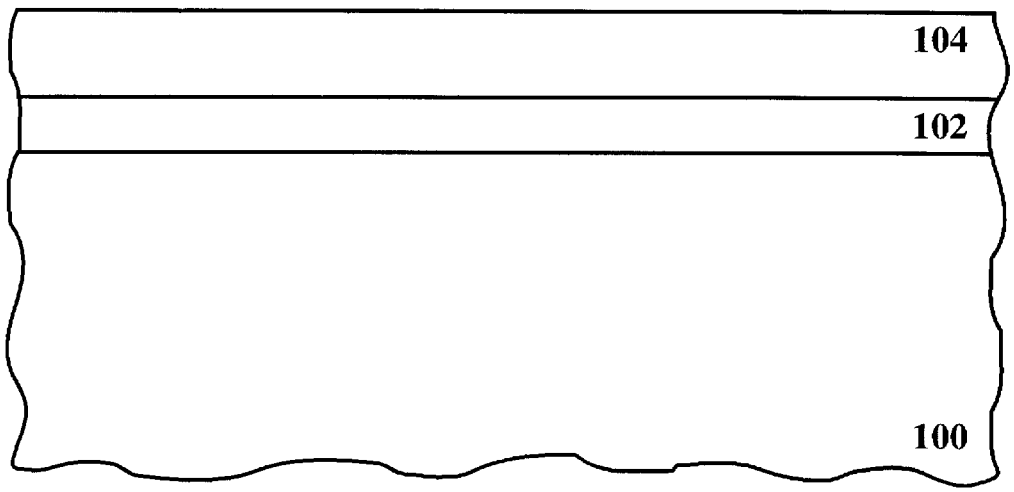
FIG. 1A is a cross-sectional view illustrating steps associated with a prior art STI process.
Figure 1B:
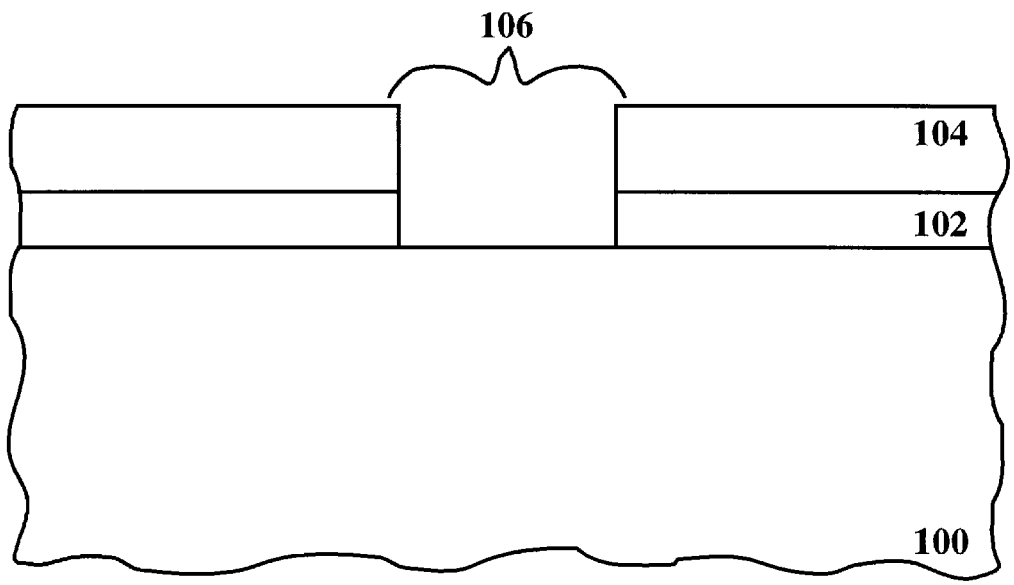
FIG. 1B is a cross-sectional view illustrating steps associated with a prior art STI process.
Figure 1C:
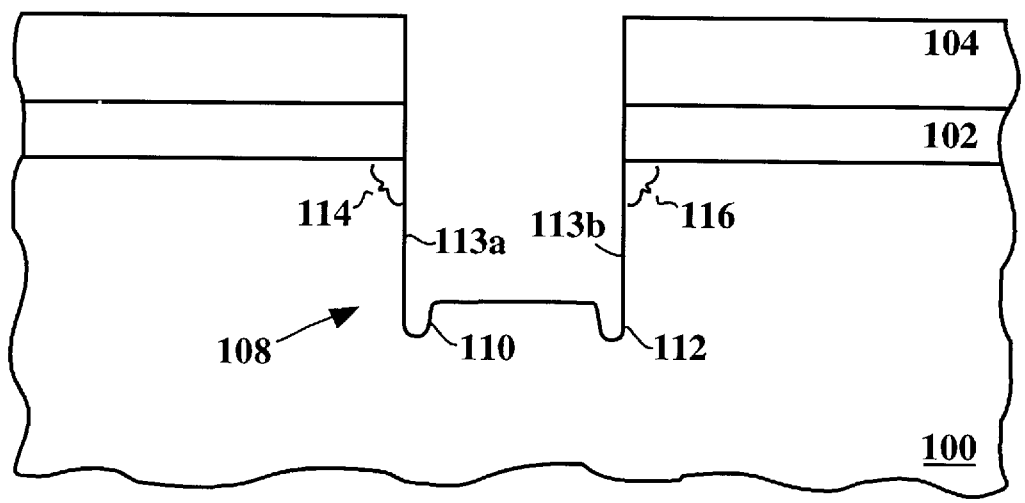
FIG. 1C is a cross-sectional view illustrating steps associated with a prior art STI process.
Figure 2A:
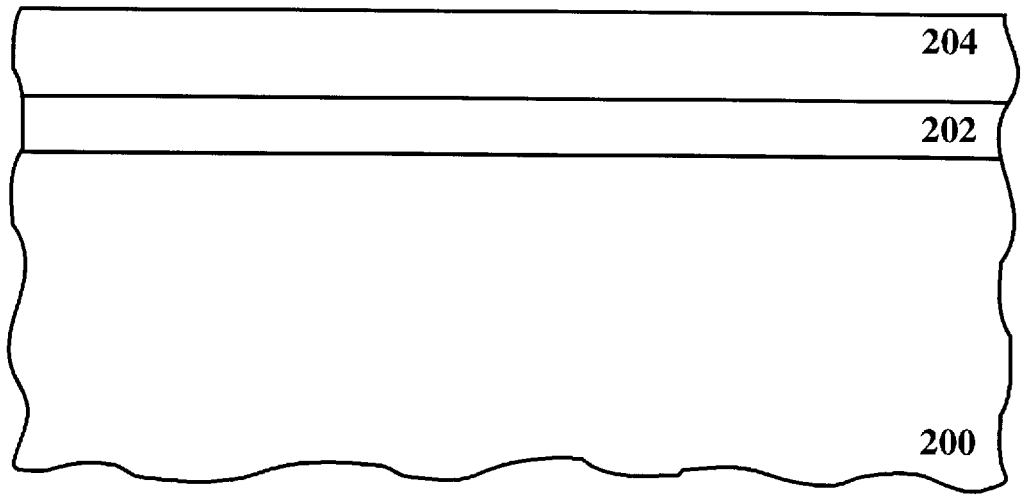
FIG. 2A is a cross-sectional view illustrating steps associated with the formation of a semiconductor device isolating structure in accordance with the present claimed invention.

The following discussion will pertain to cross-sectional views of a semiconductor device isolating structure in various states of fabrication. With reference now to FIG. 2A, a semiconductor substrate 200 such as, for example, silicon, is covered by stack comprised of an oxide layer 202 and a nitride layer 204. Although such a semiconductor substrate and stack is specified in the present embodiment, the present invention is also well suited to various other semiconductor materials, and various other stack layers.

Figure 2B:
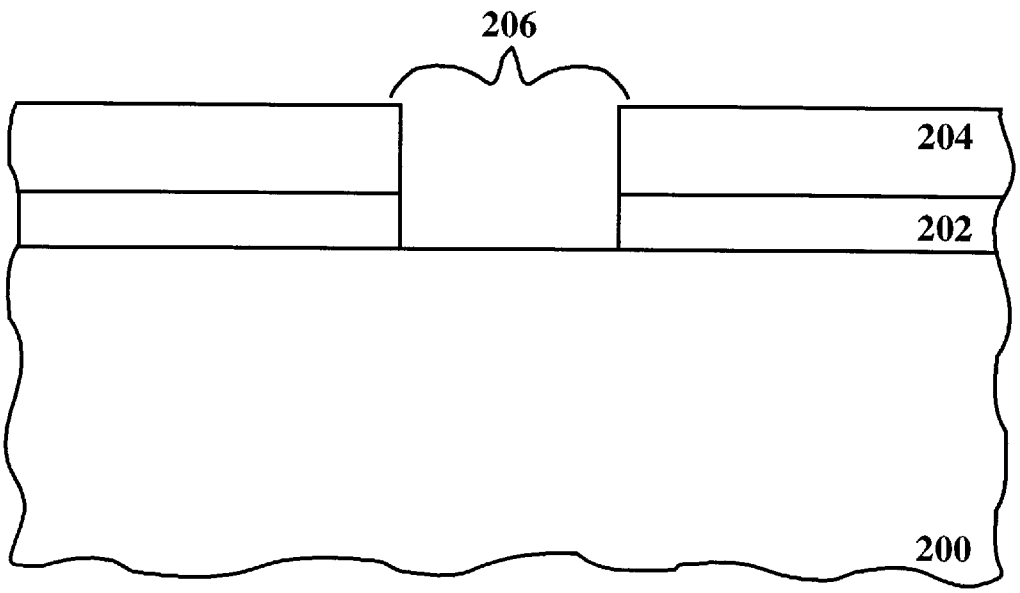
FIG. 2B is a cross-sectional view illustrating a step associated with the formation of a semiconductor device isolating structure in accordance with the present claimed invention.

Referring now to FIG. 2B, the present invention removes a portion 206 of the stack. In so doing, the top surface of semiconductor substrate 200 is exposed. Next, the semiconductor substrate 200 and overlying stack 202 and 204 are exposed to a plasma etching environment. Unlike the $Cl_2$/HBr etching environment of conventional shallow trench isolation processes, in the present embodiment, the etching environment is comprised of helium, oxygen, chlorine, and hydrogen bromide. More specifically, the present embodiment introduces helium into the etching environment at a rate of 100 standard cubic centimeters per minute (sccm). The present embodiment also introduces, into the etching environment, oxygen at a rate of 5 sccm, chlorine at a rate of 70 sccm, and hydrogen bromide at a rate of 70 sccm. Although such rates are used in the etching environment of the present invention, the present invention is also well suited to using various other rates. That is, the present invention well suited to varying the rates such that helium is introduced into the etching environment at a rate in the range of 25–500 sccm. The present invention is also well suited to introducing oxygen into the etching environment at a rate in the range of 1–20 sccm; introducing chlorine into the etching environment at a rate in the range of 25–500 sccm; and introducing hydrogen bromide into the etching environment at a rate in the range of 0–500 sccm. The present invention is also well suited to using a chemistry which does not employ hydrogen bromide. Hence, the present invention is well suited to using a $Cl_2$/HBr/He/$O_2$ etching environment or a $Cl_2$/He/$O_2$ etching environment.

The present invention is also well suited to defining the components of the etching environment in terms of component ratios. More specifically, in the present embodiment, the etching environment is optimally comprised of 42 percent helium, 2 percent oxygen, 28 percent chlorine, and 28 percent hydrogen bromide. Although such ratios are used in the etching environment of the present invention, the present invention is also well suited to varying the component ratios. That is, the present invention is well suited to having an etching environment comprised of 5–50 percent helium, 0.5–20 percent oxygen, 10–90 percent chlorine, and 0–60 percent hydrogen bromide.

Figure 2C:
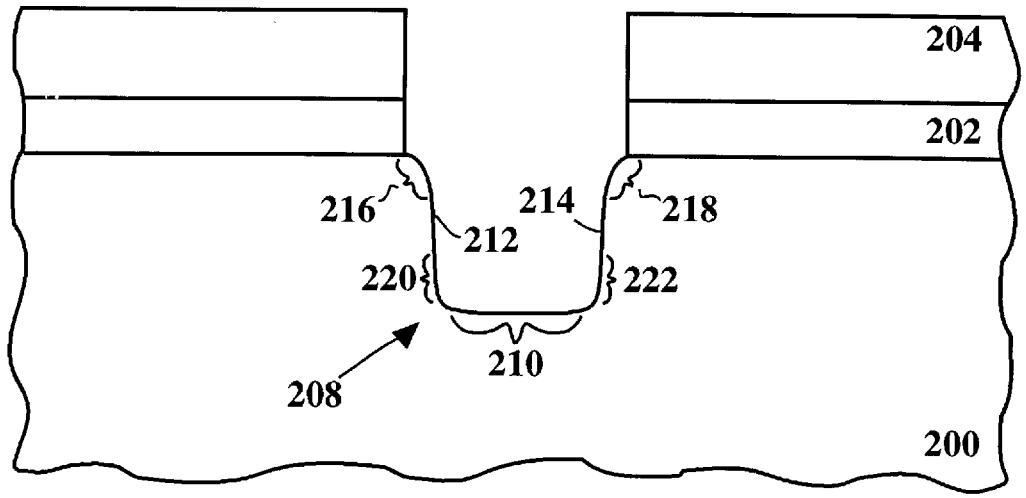
FIG. 2C is a cross-sectional view illustrating a step associated with the formation of a semiconductor device isolating structure in accordance with the present claimed invention.

Referring next to FIG. 2C, as shown in the cross-sectional view, trench 208 of the present semiconductor device isolating structure has an idealized profile. That is, trench 208 of the present invention has a substantially planar bottom surface 210. More specifically, the present etching environment generates a trench 208 which does not have micro-trenches formed therein. Thus, the present etching environment eliminates micro-trench formation. Hence, deposition of a dielectric material into trench 208 does not result in the formation of voids therein.

Referring still to FIG. 2C, trench 208 of the present invention has several other substantially advantageous features. As one example, in cross-sectional view, trench 208 has inwardly sloping sidewalls 212 and 214. That is, sidewalls 214 and 214 slope inwardly towards the center of substantially planar bottom surface 210. The present etching environment causes an oxide-rich polymer to be formed during the etching of trench 208. The oxide-rich polymer is attracted to nitride, and thus initially coats the vertically oriented portion of nitride layer 204. This oxide-rich polymer coating process continues until the vertically oriented portion of nitride layer 204 is fully coated with the oxide-rich polymer. As a result, the oxide-rich polymer disposed on the side of nitride layer 204 "shields" that portion of semiconductor substrate 200 which underlies the oxide-rich polymer. Hence, in the present etching environment, the rate at which semiconductor substrate 200 is etched varies as a function of the distance from the vertical oriented portion of nitride layer 204. In the present embodiment, sidewalls 212 and 214 slope inwardly towards the center of substantially planar bottom surface 210 at an angle in the range of 65–85 degrees. Unlike the vertically oriented sidewalls found in trenches formed using a conventional STI process, sloped sidewalls 212 and 214 of trench 208 facilitate and enhance the attachment of dielectric material thereto.

Referring yet again to FIG. 2C, the cross-sectional view of trench 208 illustrates another substantially advantageous feature of the present invention. Namely, trench 208 has rounded upper corners 216 and 218, and rounded bottom corners 220 and 222. Again, the oxide-rich polymer coating effect achieved by the present etching environment shields upper corners 216 and 218 from aggressive etching. As a result, trench 208 of the present invention has smooth rounded upper corners 216 and 218 at the interface of sloped sidewalls 212 and 214, respectively, and the top surface of semiconductor substrate 200. In so doing, trench 208 of the present invention drastically reduces stress in the contact between subsequently deposited dielectric material and semiconductor substrate 200 at corners 216 and 218. Furthermore, smooth rounded bottom corners 220 and 222 further facilitate and enhance coating and bonding of subsequently deposited dielectric material to trench 208.

Figure 2D:
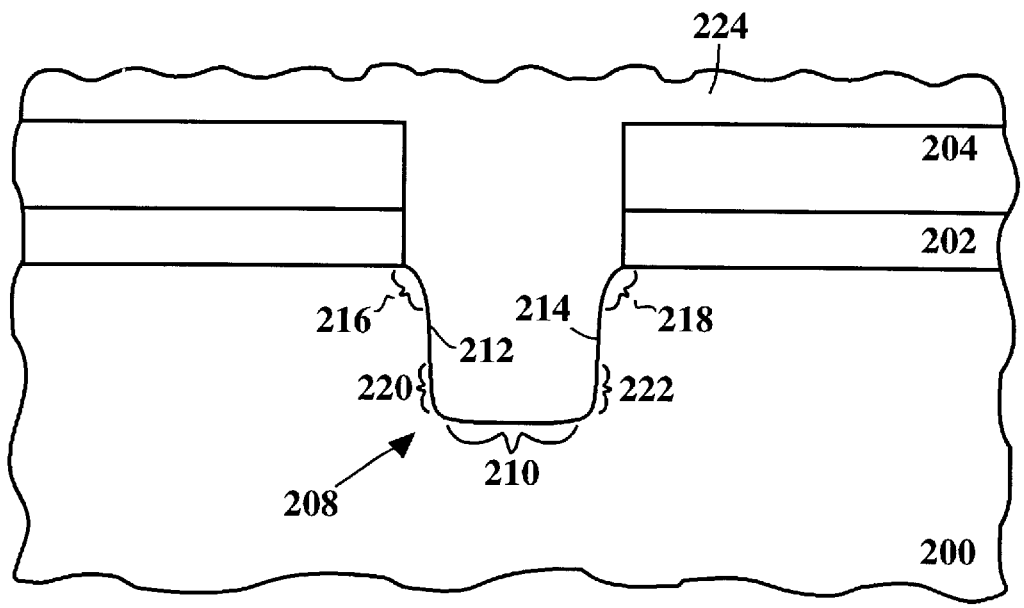
FIG. 2D is a cross-sectional view illustrating a step associated with the formation of a semiconductor device isolating structure in accordance with the present claimed invention.

Referring now to FIG. 2D, after the formation of trench 208, dielectric material 224 is deposited therein. In the present embodiment, dielectric material 224 is deposited into trench 208 via a low pressure chemical vapor deposition (LPCVD). As a result, dielectric material 224 is deposited into trench 208 and over the top surface of nitride layer 204. In the present embodiment, dielectric material 224 is comprised of silicon dioxide. Although such a dielectric material is used in the present embodiment, the present invention is also well suited to having various other dielectric materials deposited into trench 208.

Figure 2E:
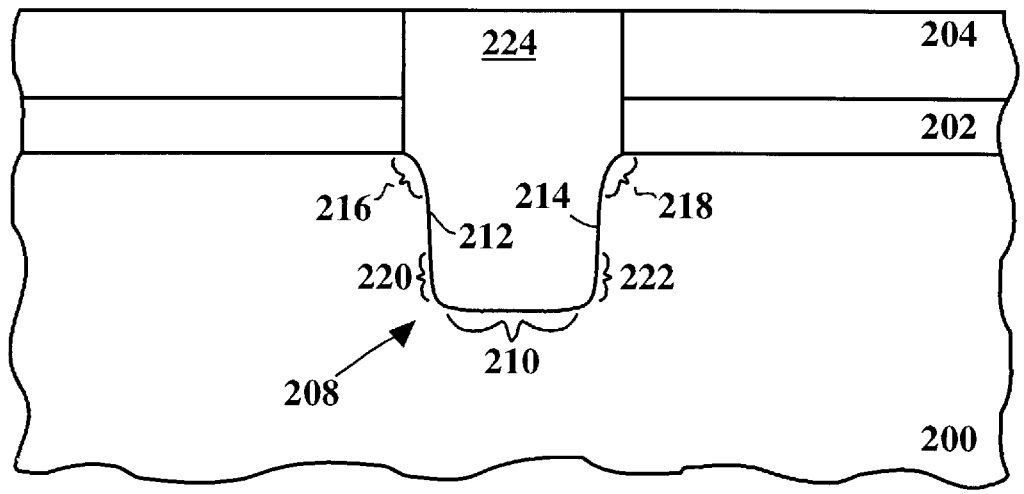
FIG. 2E is a cross-sectional view illustrating a step associated with the formation of a semiconductor device isolating structure in accordance with the present claimed invention.

With reference next to FIG. 2E, after the deposition of dielectric material 224, excess dielectric material is removed. In the present embodiment, the excess dielectric material is removed using a chemical mechanical polishing (CMP) process. The top surface of nitride layer 204 acts as a stop for the CMP process in the present embodiment. Thus, the top surface of dielectric material 224 deposited into trench 208 is coplanar with the top surface of nitride layer 204. Therefore, the present invention maintains a planar topography even after the formation of the semiconductor isolating device. Although a CMP process is used to remove the excess dielectric material in the present embodiment, the present invention is also well suited to using various other methods to remove the excess dielectric material.

Figure 2F:
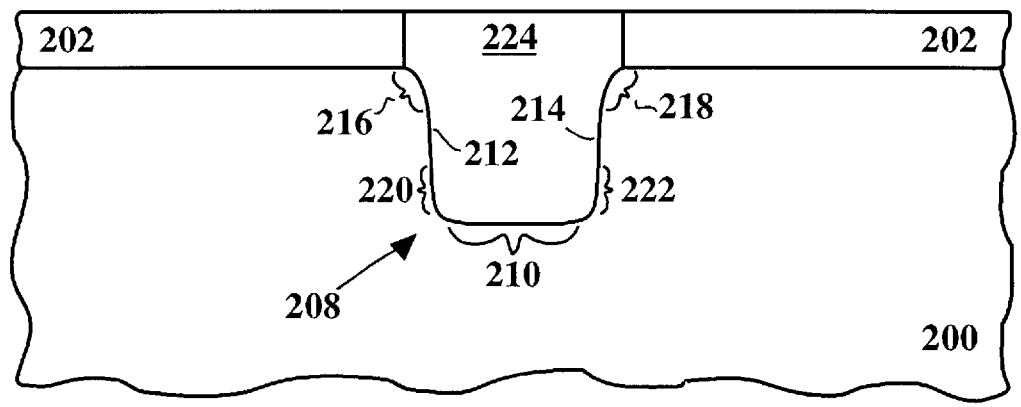
FIG. 2F is a cross-sectional view illustrating a step associated with the formation of a semiconductor device isolating structure in accordance with the present claimed invention.

Referring now to FIG. 2F, a cross-sectional view of semiconductor device isolating structure in accordance with the present invention is shown after nitride layer 204 has been removed. Hence, a void-free semiconductor device isolating structure is formed. Furthermore, the present invention provides a leakage free semiconductor isolating device.

Thus, the present invention provides a shallow trench isolation formed structure which does not have microtrenches formed therein. The present invention further provides a shallow trench isolation formed structure which enhances sidewall bonding of a dielectric material thereto. Additionally, the present invention provides a shallow trench isolation formed structure which does not have sharp stress-generating corners.

Figure 3A:
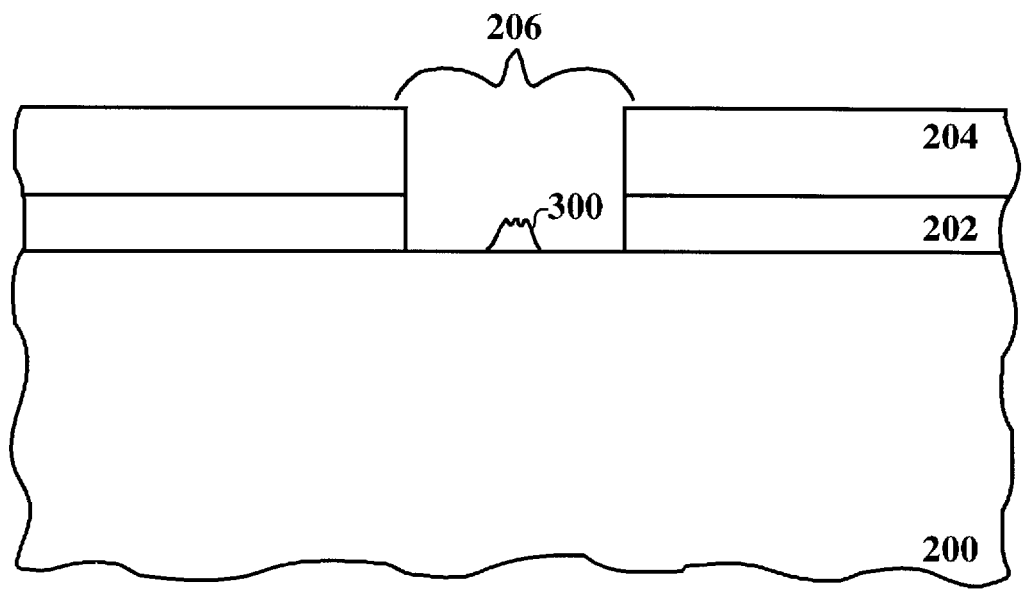
FIG. 3A is a cross-sectional view of a partially formed semiconductor device having a deleterious micromasking structure formed thereon.

With reference next to FIG. 3A, a cross-sectional view of a partially formed semiconductor device having a deleterious micromasking structure 300 formed thereon is shown. A description of the manner in which undesired micromasking structure 300 is created is given below. During native oxide removal (e.g. the removal of oxide layer 202 and a nitride layer 204), a fluorine-containing gas, such as $C_2F_6$, is typically used. After such an etching step, residual fluorine may remain within the etching environment. Next, the underlying silicon (e.g. layer 200) is etched using, for example, the above described $Cl_2/HBr/He/O_2$ or $Cl_2/He/O_2$ etching chemistries. When the residual fluorine encounters the oxygen (contained in the $Cl_2/HBr/He/O_2$ or $Cl_2/He/O_2$ etching chemistries) in the presence of silicon, a reaction can occur which causes the formation of $SiO_2$-like growths, typically shown as 300. Such $SiO_2$-like growths locally mask underlying silicon layer 200.

Figure 3B:
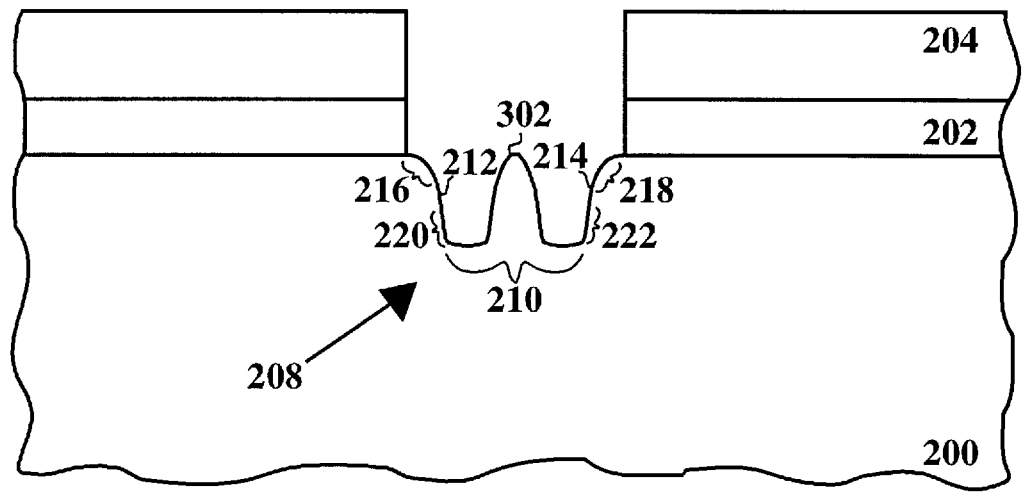
FIG. 3B is a cross-sectional view of a shallow trench having a deleterious spike formed therein.

With reference next to FIG. 3B, a cross-sectional view of a shallow trench having a deleterious spike 302 formed therein is shown. During etching of trench 208, spike 302 is formed due to the local masking provided by micromasking structure 300 of FIG. 3A. Spike 302 has a height approximately the same as the depth of trench 208. Similarly, the sides of spike 302 are sloped at approximately the same angle as are the sides 212 and 214 of trench 208. Spike 302 can be particularly devastating to device integrity because it creates an electrical path to substrate 200. Thus, spike 302 provides a conductive path through any insulating material subsequently deposited into trench 208. As a result, spike 302 negates the desired insulating effect of trench 208 and dielectric material, not shown, contained therein. The present invention, however, provides a method to eliminate deleterious micromasking and spike formation.

Figure 3C:
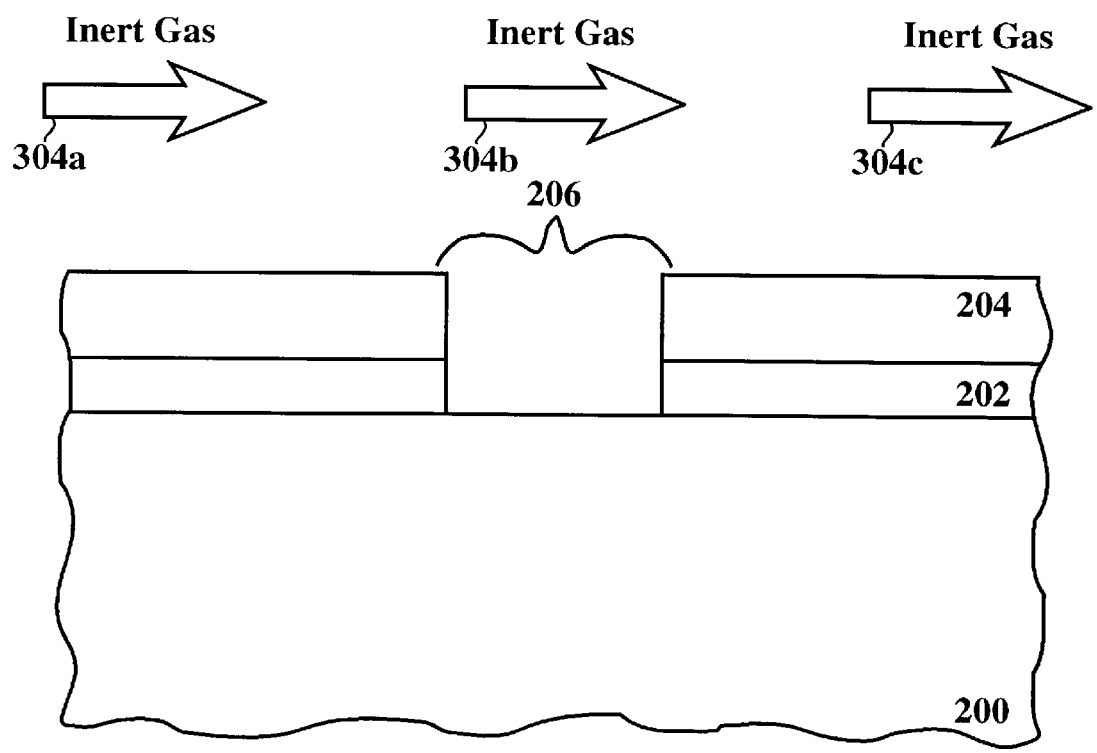
FIG. 3C is a cross-sectional view schematically illustrating an inert gas purging step employed in accordance with one embodiment of the present invention.

With reference next to FIG. 3C, a cross-sectional view schematically illustrating a step employed by the present invention is shown. In the present embodiment, after the native oxide removal step and before etching of the underlying silicon, the etching environment is purged with an inert gas such as, for example, helium as indicated by arrows 304a, 304b, and 304c. Although helium is used as the inert purging gas in the present embodiment, the present invention is also well suited to the use of various other inert gases. In the present embodiment, the inert gas is flowed through the etching environment with a low residence time (i.e. with a high flow rate and at a low pressure). The method of the present embodiment flows approximately 200 sccm of helium at approximately a 200 milliTorr etching environment pressure. The present invention is also well suited to using various other flow rates and etching environment pressures including higher flow rates and lower etching environment pressures.

By purging the etching environment with an inert gas, residual fluorine is removed from the etching environment. Thus, the oxygen contained in the $Cl_2/HBr/He/O_2$ or $Cl_2/He/O_2$ etching chemistries does not contact residual fluorine in the presence of silicon. As a result, reactions which cause the formation of $SiO_2$-like growths are prevented. Hence, micromasking structures and subsequent spike formations are eliminated.

In yet another embodiment, after the native oxide removal step, the etching of the underlying silicon is started without using any oxygen in the etching environment. By starting the silicon etching step without oxygen present, the residual fluorine-impregnated silicon surface is etched away exposing underlying virgin silicon. In the present embodiment, silicon etching is a two-step process. First, either a $Cl_2/HBr/He$ or a $Cl_2/He$ etching chemistry is used. Second, either of the corresponding above described $Cl_2/HBr/He/O_2$ or $Cl_2/He/O_2$ etching chemistries is used to etch the remaining virgin silicon. As a result, the oxygen-containing $Cl_2/HBr/He/O_2$ or $Cl_2/He/O_2$ etching chemistries do not contact silicon until the residual fluorine has been removed. As a result, reactions which cause the formation of $SiO_2$-like growths are prevented. Hence, micromasking structures and subsequent spike formations are eliminated.

In the present embodiment, the first of the silicon etch steps etches less silicon than the second silicon etch step. Specifically, the first of the silicon etch steps etches approximately 2–50 percent of the total silicon etch depth. Furthermore, in one embodiment, the non oxygen-containing chemistry (e.g. $Cl_2/HBr/He$) comprises 15 percent of the total etchant gas used, and the oxygen-containing chemistry (e.g. $Cl_2/HBr/He/O_2$) comprises 85 percent of the total etchant gas used. In such an embodiment, during the first of the etching steps, the present invention introduces into the etching environment helium at a rate of 100 sccm; chlorine at a rate of 70 sccm; and hydrogen bromide at a rate of 70 sccm. The present invention flows the non oxygen-containing chemistry for 5 seconds. In the second of the etching steps, the present invention introduces into the etching environment helium at a rate of 100 sccm; oxygen at a rate of 5 sccm; chlorine at a rate of 70 sccm; hydrogen bromide at a rate of 70 sccm, and oxygen at a rate of 5 sccm. The present invention flows the oxygen-containing chemistry for 27 seconds. The present invention is well suited to varying the flow rate and duration values given above.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A shallow trench isolation method for forming a trench in a semiconductor substrate comprising the steps of:

a) introducing helium into an etching environment at a rate in the range of 25–500 standard cubic centimeters per minute;

b) introducing oxygen into said etching environment at a rate in the range of 1–20 standard cubic centimeters per minute;

c) introducing chlorine into said etching environment at a rate in the range of 25–500 standard cubic centimeters per minute;

d) introducing hydrogen bromide into said etching environment at a rate in the range greater than 0 and less than 500 standard cubic centimeters per minute; and e) etching, within said etching environment, said semiconductor substrate until said trench of a desired depth is formed into said semiconductor substrate.

2. The shallow trench isolation method as recited in claim 1 wherein step e) further comprises the step of:

etching, within said etching environment, said semiconductor substrate until said trench formed into said semiconductor substrate has a cross-section, said etching to form said trench with said cross-section comprising the steps of:

etching a substantially planar bottom surface on said trench;

etching a first and a second sidewall on said trench, said sidewalls sloping inwardly towards the center of said substantially planar bottom surface;

etching a first and a second rounded bottom trench corner on said trench at an interface of said first sidewall and said substantially planar bottom surface; and etching a first and a second rounded upper trench corner on said trench at the interface of said first and said second sidewall respectively and a top surface of said semiconductor substrate.

3. The shallow trench isolation method as recited in claim 1 further comprising the step of:

f) filling said trench with a dielectric material.

4. The shallow trench isolation method as recited in claim 3 wherein step f) further comprises the step of:

filling said trench with silicon dioxide.

5. The shallow trench isolation method as recited in claim 1 wherein step a) comprises the step of:

introducing helium into said etching environment such that said helium comprises in the range of 5–50 percent by volume of etchant gas.

6. The shallow trench isolation method as recited in claim 1 wherein step b) comprises the step of:

introducing oxygen into said etching environment such that said oxygen comprises in the range of 0.5–20 percent by volume of etchant gas.

7. The shallow trench isolation method as recited in claim 1 wherein step c) comprises the step of:

introducing chlorine into said etching environment such that said chlorine comprises in the range of 10–90 percent by volume of etchant gas.

8. The shallow trench isolation method as recited in claim 1 wherein step d) comprises the step of:

introducing hydrogen bromide into said etching environment such that said hydrogen bromide comprises in the range greater than 0 percent and less than 60 percent by volume of etchant gas.

9. The shallow trench isolation method as recited in claim 1 further comprising the step of:

flowing an inert gas through said etching environment after a native oxide removal and before steps a) through e) are performed.

10. The shallow trench isolation method as recited in claim 9
wherein said inert gas is helium.

11. The shallow trench isolation method as recited in claim 1 further comprising the step of:
   f) masking said semiconductor substrate with a mask layer to define the location of said trench; and
   g) removing said mask layer such that a semiconductor isolating device is formed into and extends above said semiconductor substrate.

12. The shallow trench isolation method as recited in claim 3 further comprising the steps of:
   g) removing excess dielectric material such that said dielectric material is substantially coplanar with a top surface of a mask layer disposed above said semiconductor substrate.

13. A shallow trench isolation method for forming a semiconductor device isolating structure comprising the steps of:
   a) introducing helium into an etching environment;
   b) introducing oxygen into said etching environment;
   c) introducing chlorine into said etching environment;
   d) introducing hydrogen bromide into said etching environment; and
   e) etching, within said etching environment, a semiconductor substrate until a trench of a depth and cross-section is formed into said semiconductor substrate, the location of said trench in said semiconductor substrate defined by a mask layer disposed above said semiconductor substrate, said etching to form said trench with said cross-section comprising the steps of:
      etching a substantially planar bottom surface in said trench,
      etching a first and a second sidewall in said trench sloping inwardly towards the center of said substantially planar bottom surface;
      etching a first and a second rounded bottom trench corner in said trench at an interface of said first sidewall and said substantially planar bottom surface; and
      etching a first and a second rounded upper trench corner in said trench at the interface of said first and said second sidewall respectively and a top surface of said semiconductor substrate.

14. The shallow trench isolation method of claim 13 wherein step a) comprises the step of:
   introducing helium into said etching environment at a rate in the range of 25–500 standard cubic centimeters per minute.

15. The shallow trench isolation method of claim 13 wherein step b) comprises the step of:
   introducing oxygen into said etching environment at a rate in the range of 1–20 standard cubic centimeters per minute.

16. The shallow trench isolation method of claim 13 wherein step c) comprises the step of:
   introducing chlorine into said etching environment at a rate in the range of 25–500 standard cubic centimeters per minute.

17. The shallow trench isolation method of claim 13 wherein step d) comprises the step of:
   introducing hydrogen bromide into said etching environment at a rate in the range greater than 0 and less than 500 standard cubic centimeters per minute.

18. The shallow trench isolation method of claim 13 further comprising the step of:
   filling said trench with dielectric material.

19. The shallow trench isolation method as recited in claim 13 wherein step a) comprises the step of:
   introducing helium into said etching environment such that said helium comprises in the range of 5–50 percent by volume of etchant gas.

20. The shallow trench isolation method as recited in claim 13 wherein step b) comprises the step of:
   introducing oxygen into said etching environment such that said oxygen comprises in the range of 0.5–20 percent by volume of etchant gas.

21. The shallow trench isolation method as recited in claim 13 wherein step c) comprises the step of:
   introducing chlorine into said etching environment such that said chlorine comprises in the range of 10–90 percent by volume of etchant gas.

22. The shallow trench isolation method as recited in claim 13 wherein step d) comprises the step of:
   introducing hydrogen bromide into said etching environment such that said hydrogen bromide comprises in the range greater than 0 percent and less than 60 percent by volume of etchant gas.

23. The shallow trench isolation method as recited in claim 13 further comprising the step of:
   flowing an inert gas through said etching environment after a native oxide removal and before steps a) through e) are performed.

24. The shallow trench isolation method as recited in claim 23 wherein said inert gas is helium.

25. The shallow trench isolation method as recited in claim 13 further comprising the steps of:
   f) masking said semiconductor substrate with a mask layer to define the location of said trench; and
   g) removing said mask layer such that a semiconductor isolating device is formed into and extends above said semiconductor substrate.

26. The shallow trench isolation method of claim 18 wherein said dielectric material is silicon dioxide.

27. The shallow trench isolation method as recited in claim 26 further comprising the step of:
   g) removing excess dielectric material such that said dielectric material is substantially coplanar with said top surface of said mask layer disposed above said semiconductor substrate.

* * * * *